United States Patent [19]

Coleman

[11] Patent Number: 5,155,062

[45] Date of Patent: * Oct. 13, 1992

[54] METHOD FOR SILICON CARBIDE CHEMICAL VAPOR DEPOSITION USING LEVITATED WAFER SYSTEM

[75] Inventor: Thomas G. Coleman, Durham, N.C.

[73] Assignee: Cree Research, Inc., Durham, N.C.

[*] Notice: The portion of the term of this patent subsequent to Jun. 9, 2009 has been disclaimed.

[21] Appl. No.: 632,120

[22] Filed: Dec. 20, 1990

[51] Int. Cl.$^5$ ............................................. H01L 21/20
[52] U.S. Cl. ................................. 437/100; 437/173; 148/DIG. 148
[58] Field of Search .............................. 437/100, 173; 148/DIG. 148, DIG. 41

[56] References Cited

U.S. PATENT DOCUMENTS

| | | | |
|---|---|---|---|
| 3,627,590 | 12/1971 | Mammel | 437/82 |
| 3,996,891 | 12/1976 | Isawa et al. | 437/119 |
| 4,029,045 | 6/1977 | Cielaszyk et al. | 118/716 |
| 4,593,168 | 6/1986 | Amada | 437/174 |
| 4,860,687 | 8/1989 | Frijlink | 118/500 |

FOREIGN PATENT DOCUMENTS

3608783C2 6/1989 Fed. Rep. of Germany .
61-294812 12/1986 Japan .

OTHER PUBLICATIONS

Neumann et al; Hydrodynamic Description of Vapor Levitation Epitaxy; Jrnl. of Crystal Growth 92(1988) pp. 397–406.
Keramidas; Vapor Levitation Epitaxy—A New Concept in Crystal Growth; Jrnl. of Metals; Jan.; p.58.
Cox et al; Vapor levitation epitaxial growth of IN-GaAsP alloys using trichloride sources; Inst. Phys. Conf. Ser. No. 70; Chapter 13.
Cohen; Afternoon THP; May 23, 1985; THP1 Fabrication and transmission characteristics of low-loss mid-infrared optical fibers.
Cox, et al.; Vapor Levitation Epitaxy; System Design and Performance; Jrnl. of Crystal Growth 79(186) pp. 900–908.
Schweitzer et al.; Magnetische Lagerung einer Epitaxie-Zentrifuge bei Hochvakuumbedingungen; Vakuum-Technik-32 Jahrgang-Heft 3.

Primary Examiner—Brian E. Hearn
Assistant Examiner—Trung Dang
Attorney, Agent, or Firm—Bell, Seltzer, Park & Gibson

[57] ABSTRACT

A method and apparatus for substantially preventing undesired residual dopants or other impurities from becoming incorporated in growing epitaxial layers of silicon carbide during CVD by avoiding the use of a susceptor for CVD epitaxial growth is disclosed. During the CVD process, the substrate is suspended substantially out of physical contact with any other solid object while a suitable surface of the semiconductor substrate is contacted with source gases that will form epitaxial layers of silicon carbide thereon. Heating during the CVD process is performed, according to the present invention, by inductively heating the substrate using an induction frequency to which the substrate material is sufficiently responsive to heat the substrate to the temperatures required for CVD of silicon carbide.

13 Claims, 1 Drawing Sheet

METHOD FOR SILICON CARBIDE CHEMICAL VAPOR DEPOSITION USING LEVITATED WAFER SYSTEM

FIELD OF THE INVENTION

The present invention relates to semiconductor manufacturing including systems performing chemical vapor deposition, and in particular to chemical vapor deposition of epitaxial layers of silicon carbide This invention is related to copending U.S. patent application Ser. No. 07/558,196; filed Jul. 24, 1990, to Kong et al. for "Method and Apparatus for Eliminating Nitrogen Contamination in Epitaxial Layers of Silicon Carbide and Resulting Product."

BACKGROUND OF THE INVENTION

Chemical vapor deposition (CVD) of epitaxial layers on semiconductor substrates is well known in the semiconductor manufacturing art. Various materials, including silicon carbide (SiC), may be employed as epitaxial layers. Specifically, the chemical vapor deposition of SiC presents a number of problems to those in the semiconductor manufacturing industry.

Silicon carbide has long been a candidate material for use in electronic devices, particularly those intended for high temperature, high power, and high frequency use. Silicon carbide has an extremely high melting point, a relatively large energy bandgap, a high saturated electron drift velocity, a high breakdown field strength, a high thermal conductivity, and superior chemical resistance. Its large energy bandgap also makes it an excellent material for blue light emitting diodes (LEDs) and for use in radiation intensive environments.

In particular, intrinsic silicon carbide epitaxial layers grown by chemical vapor deposition have a carrier concentration of nitrogen that generally is always at least $1 \times 10^{17}$ atoms per cubic centimeter ($cm^{-3}$("1E17"). Conventional wisdom holds that this intrinsic nitrogen is a consequence of nitrogen present in the source and carrier gases used during chemical vapor deposition. The result is that intrinsic silicon carbide epitaxial layers will always have donor atoms present to at least this extent. Although this may not present a problem when the resulting silicon carbide is to be n-type, it raises significant difficulties when p-type silicon carbide is desired. Because of intrinsic nitrogen, such p-type epitaxial layers will always be "compensated" with a nitrogen donor to at least the extent of $1 \times 10^{17} cm^{-3}$(1E17). As is known to those familiar with semiconductor devices and technology, such compensation can limit the usefulness or application of devices produced using such materials.

For example, in rectifying diodes, a higher population of donor (n-type) carriers in the p-type material lowers the reverse breakdown voltage of the resulting rectifier. Stated differently, the development of rectifying diodes with desirable or necessary higher breakdown voltages requires a minimization of donor carriers in p-type layers. In light emitting diodes ("LED's), the presence of impurities such as intrinsic nitrogen brings a corresponding presence of undesired potential energy levels and unwanted transitions within the preferred bandgap. These undesired transitions generate photons of undesired wavelengths and thus pollute the color of light produced by the LED.

In conventional semiconductor techniques, however, the reasons for the presence of nitrogen as an unwanted intrinsic donor have not been recognized. This lack of recognition of the problem raised by nitrogen with respect to silicon carbide probably results from the fact that nitrogen does not act as a donor in silicon, the most widely used semiconductor material. Thus, the presence of 1E17 of nitrogen in silicon does not present the problem that such a concentration presents in silicon carbide.

Furthermore, chemical vapor deposition growth of silicon carbide typically takes place at temperatures much higher than the temperatures at which corresponding CVD growth of silicon takes place. For example, CVD of silicon takes place at temperatures of no more than about 1200° C., while that of silicon carbide preferably takes place at least about 1500° C. or higher. At higher temperatures, there exists a greater probability that the problem of impurities will be exacerbated. In CVD growth of silicon carbide, however, higher temperatures promote fewer defects in the resulting crystals. Thus, the higher quality LED's are preferably formed from epitaxial layers grown at least 1500°, and desirably at even higher temperatures, but conventional CVD systems and susceptors are only suitable at temperatures of about 1250° C. or less.

In contrast to the conventional wisdom as to the root of the nitrogen contamination problem, the present inventors have discovered that much, and very likely all, of the nitrogen contamination in intrinsic silicon carbide is a result of nitrogen gas that escapes from the susceptors during chemical vapor deposition. Because CVD growth of silicon carbide typically takes place at temperatures well above those necessary for CVD growth of silicon, such "out gases" may not be generated during silicon growth, and the problems they raise have accordingly remained unobserved prior to the more recent advances in silicon carbide technology described earlier.

It has thus only recently been observed that at the high temperatures required for CVD growth of silicon carbide, the silicon carbide coatings on most graphite susceptors begin to develop minute mechanical failures, often exhibited as cracks or pinholes. Because graphite is an excellent absorbent for many gases, it appears that in some cases, gases trapped in the graphite before the susceptor was formed escape through these cracks and pinholes and contaminate the silicon carbide epitaxial layers grown using such susceptors. For example, in most susceptor manufacturing processes, the coating system is merely purged with hydrogen prior to being coated with silicon carbide, a step that takes place after the graphite has been exposed to nitrogen In some cases, nitrogen is intentionally added during the coating process. In other cases it appears that susceptors will absorb atmospheric nitrogen every time a CVD growth cycle is completed and the growth chamber opened.

Thus, the relatively high intrinsic donor concentration of epitaxial layers of silicon carbide grown by chemical vapor deposition has remained a problem for which conventional wisdom and techniques have failed to provide a solution.

In addition to the nitrogen contamination problem, other problems with the CVD process have presented themselves. One of these problems includes heating the semiconductor substrate during the CVD process. Many types of heating used in conventional CVD systems, such as radiant heating heat not only the substrate but also parts of the CVD system itself. As a result of such undirected heating, more time is required to heat the substrate. In addition, the undirected nature of radiant heating results in uneven heating throughout the substrate with accompanying defects in the resulting crystal structure of the epitaxial layer being formed.

These problems have recently been addressed in the aforementioned copending U.S. patent application Ser. No. 07/558,196, in which epitaxial layers of SiC are formed by reducing the carrier concentration of nitrogen. The nitrogen concentration is reduced by using a susceptor formed of a material that will not generate undesired nitrogen containing out gases at the temperatures at which CVD of SiC take place.

Another attempt at addressing the purity problem—although not for CVD growth of silicon carbide—has been to eliminate the susceptor in a vapor levitation epitaxy technique described by H. M. Cox, S. G. Hummel, and V. G. Keramidas at Bell Communications Research, Murray Hill, N.J. Their publications include "*Vapor Levitation Epitaxial Growth of InGaAsP Alloys Using Trichloride Sources*", Inst. Phys. Conf. Ser. No. 79: Chapter 13, page 735 (1986); and "*Vapor Levitation Epitaxy: system Design and Performance*", J. Crystal Growth 79 (1986) 900–908. These works never addressed, however, the specific problem presented by the growth of silicon carbide, which crystallizes in over 150 polytypes, most separated by very small thermodynamic differences.

Others have avoided use of a susceptor, for reasons other than reduction of nitrogen generation, by levitating the substrate through the use of source or other gases. For example, the Mammel U.S. Pat. No. 3,627,590 patent describes a CVD system for epitaxial growth of thin films on a substrate that is levitated using a gas flow. Mammel, however, uses radiant heating and susceptor heating and employs a face up orientation of the substrate during CVD.

Accordingly, it is an object of the present invention to provide an improved method and associated apparatus for producing epitaxial layers of such silicon carbide by chemical vapor deposition, to produce intrinsic silicon carbide in which the carrier concentration of nitrogen is less than $5 \times 10^{16} cm^{-3}$, and to provide for heating of the semiconductor substrate in a CVD system which is directed, controllable and even.

SUMMARY OF THE INVENTION

The invention comprises a method of substantially preventing undesired residual dopants or other impurities from becoming incorporated in growing epitaxial layers of silicon carbide during CVD by avoiding the use of a susceptor for CVD epitaxial growth. In one embodiment, this method comprises the steps of suspending a substrate, formed of a material upon which epitaxial layers of silicon carbide will form and having at least one surface suitable for epitaxial growth of silicon carbide thereon substantially out of contact with any other object. During the CVD process a suitable surface of the semiconductor substrate is contacted with source gases that will form epitaxial layers of silicon carbide thereon. Heating during the CVD process is performed, according to the present invention, by inductively heating the substrate using an induction frequency to which the substrate material is sufficiently responsive to heat the substrate to the temperatures required for CVD of silicon carbide.

BRIEF DESCRIPTION OF THE DRAWINGS

The foregoing objects and advantages of the invention can best be understood by reference to the detailed description taken in conjunction with the accompanying drawings in which.

DETAILED DESCRIPTION OF THE INVENTION

Figure 1:
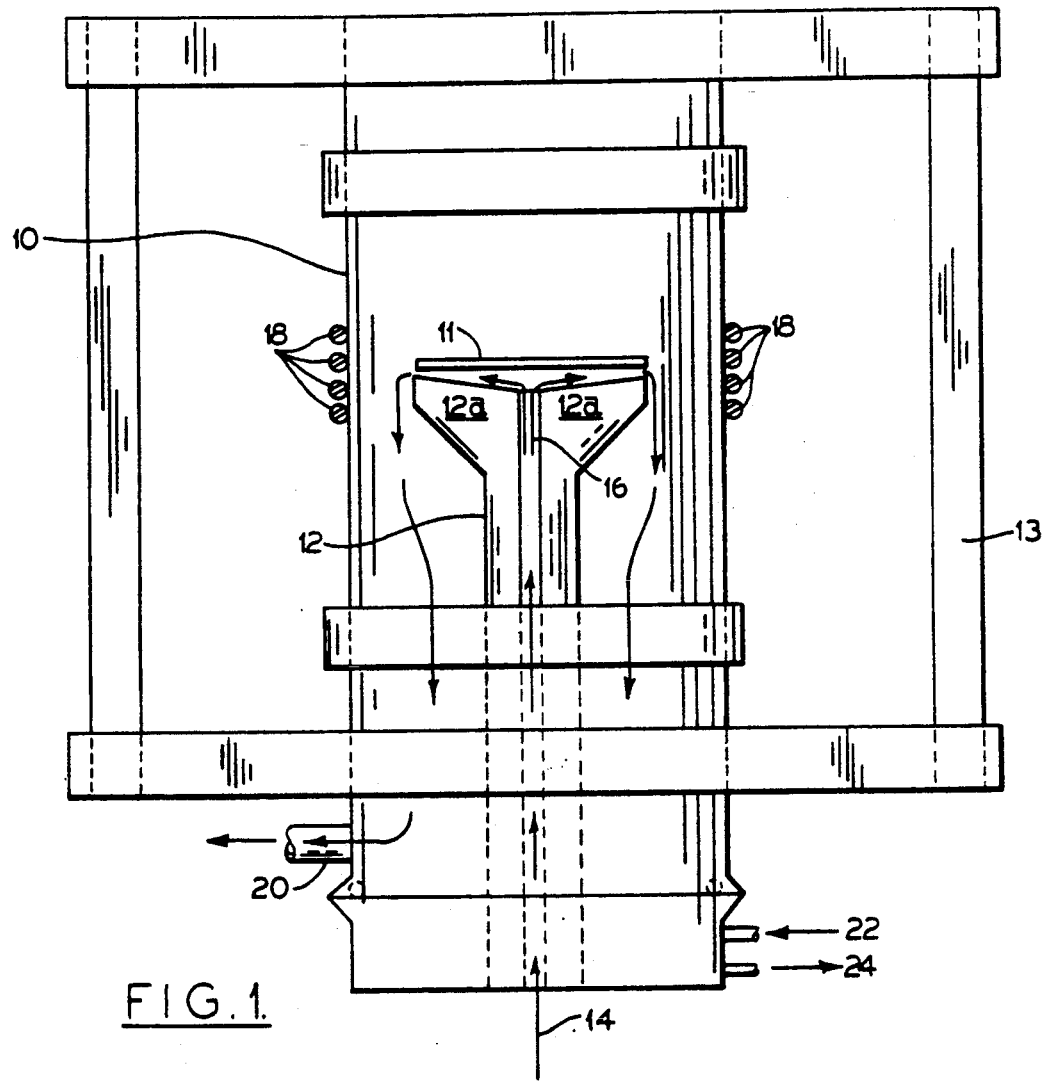
FIG. 1 is a schematic view of a first embodiment of a levitated wafer system according to the present invention.

The present invention will now be described more fully hereinafter with reference to the accompanying drawings, in which a preferred embodiment of the invention is shown. This invention may, however, be embodied in many different forms and should not be construed as limited to the embodiment set forth herein; rather, Applicant provides this embodiment so that this disclosure will be thorough and complete, and will fully convey the scope of the invention to those skilled in the art.

Like characters refer to like elements throughout. For greater clarity, the size of the various elements may not be illustrated to scale.

The present invention is a method of substantially preventing undesired residual dopants or other impurities from becoming incorporated in growing epitaxial layers of silicon carbide during CVD by avoiding the use of a susceptor for CVD epitaxial layer growth.

In one embodiment, this method comprises the steps of suspending a substrate, formed of a material upon which epitaxial layers of silicon carbide will form and having at least one surface suitable for epitaxial growth of silicon carbide thereon. The substrate may be positioned face down for epitaxial layer growth in a downwardly facing direction. Alternatively, the substrate may be positioned so that epitaxial growth takes place in an upward direction. The substrate is then substantially out of contact with any other solid object.

During the CVD process a suitable surface of the semiconductor substrate is contacted with gases that will form epitaxial layers of silicon carbide thereon. Source gases appropriate for this function are silane, ethylene, and hydrogen. As known to those familiar with chemical vapor deposition, other gases such as hydrogen may be employed in the system along with the source gases. These gases function as carriers, backfillers or coolants to control the growth rate of films. The appropriate amounts, flow rates, pressures, and proportions of such gases used can be developed by those of ordinary skill in this art, and without undue experimentation.

In another embodiment, the suspending of the substrate in an upward flow of gases is done by suspending the substrate in the substantial absence of gases other than source gases.

The substrate in any of the embodiments may also be suspended so that a suitable surface of the substrate is maintained in a substantially horizontal orientation during CVD of SiC thereon. The substrate itself may be SiC and may have surface portions that are substantially greater than its thickness.

Heating during the CVD process is performed, according to the present invention, by inductively heating the substrate using an induction frequency to which the substrate material is sufficiently responsive to heat the substrate to the temperatures required for CVD silicon carbide. Appropriate induction frequencies for silicon carbide are those of at least 500 kilohertz (kHz) and a preferred frequency is 3.56 megahertz.

The heating of the substrate may occur using electromagnetic energy in the radio frequency or microwave frequency range. Specifically, the inductive heating of the substrate may be accomplished by positioning the substrate within an electric field formed by an alternating current electromagnetic wave of relatively high frequency. Operative frequencies for this heating are 13.56 megahertz, which is a Federal Communications Commission (FCC) accepted frequency for use in scientific and industrial applications. As those skilled in the art know, such a high frequency is generally used to generate plasmas rather than to perform inductive heating.

Alternatively, the substrate may be heated by applying microwave energy to a waveguide that focuses the microwave energy upon the silicon carbide substrate.

Inductive heating offers a number of significant advantages in the present invention. The foremost of these is the elimination of radiant heating. In a radiant heating process, such as described by Cox, et al., a number of materials other than the substrate become heated. This wastes energy and can cause process problems, e.g., CVD growth on the hot walls of a reaction chamber. Radiant heating is also difficult to localize, relatively hard to control, generates environmental heat, and requires relatively long start up times.

In contrast, induction heating rapidly heats the material itself in localized fashion, is easy to control, lends itself to automation, requires minimal start up time, and minimizes or eliminates heating of the immediate surroundings.

Relatively thorough discussions of specific epitaxial growth techniques applicable to silicon carbide are set forth in U.S. Pat. Nos. 4,912,063 and 4,912,064 to Kong, et al. and Davis, et al. respectively, and these are incorporated entirely herein by reference.

A first embodiment of the present invention is shown in FIG. 1. Here the invention comprises a reaction chamber, which in preferred embodiments is formed of a quartz tube 10 supported by an appropriate framework 13 The system also comprises a substrate support 12 formed of a material that will not substantially respond to induction frequencies to which the silicon carbide will respond. Such materials include quartz, boron nitride and ceramic insulating materials. The support 12 is typically positioned inside of and substantially coaxially with the quartz tube 10. The support 12 may contain means for aligning the substrate 11 shown in FIG. 1 in the form of the supporting shoulders 12a. The system may include means in the support for receiving source gases introduced from outside the reaction chamber 10, shown here in the form of an inlet 14.

The structure may contain means, shown in FIG. 1 as outlet 16 in the support 12, for introducing the source gases into the quartz tube 10 and for suspending a substrate 11 above the support in a flow of source gases and possibly other gases that will form an epitaxial layer of silicon carbide. Separate outlets may be employed for source and other gases. Thus, in this embodiment the substrate 11 is face down and substantially out of physical contact with any other object within the reaction chamber 10 during the CVD process.

The support 12 may also contain means for directing the gases in a specific direction in order to facilitate a more even deposition of the epitaxial layer. For example, the source gases may be directed so as to spin the substrate 11. One such means is the directional shaping of outlet 16 so as to direct the gases in a particular direction. Alternatively, separate outlets may be used.

FIG. 1 also illustrates means for heating substrate 11, shown in the form of an inductive heating coil 18. Alternatively, a microwave waveguide to which microwave energy is applied may be used. As seen in FIG. 1, the induction heating coil 18 surrounding the reaction chamber 10 transmits an induction frequency to the substrate 11 that substantially heats the substrate, but to which frequencies the support 12 is substantially unresponsive.

The gases introduced within the reaction chamber 10 may be vented out of the tube 10 through pumping port 20 as seen in FIG. 1.

A coolant may be used with the system. The coolant may enter the system through coolant port 22 and exit the system through coolant output port 24 as also shown in FIG. 1.

Figure 2:
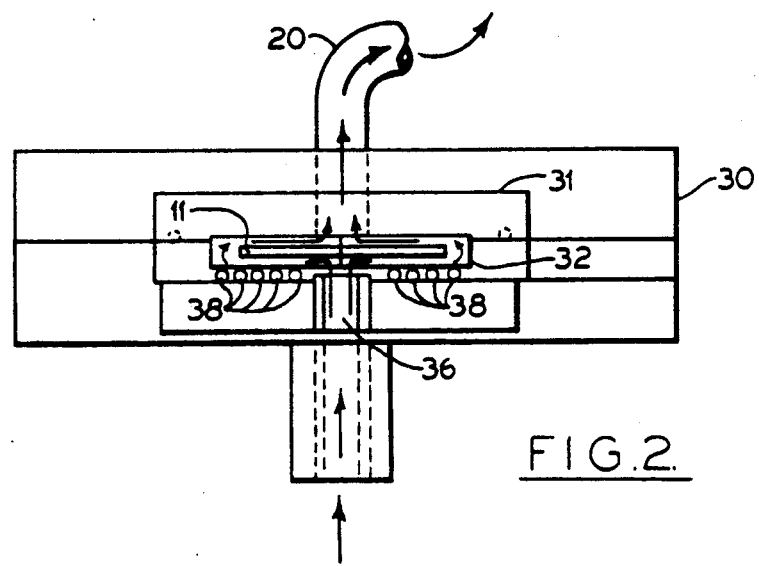
FIG. 2 is a schematic view of a second embodiment of a levitated wafer system according to the present invention.

A second embodiment of the present invention is shown in FIG. 2. This embodiment comprises a reaction chamber 30. A block 31 is positioned within the chamber 30 and formed of a material that does not substantially respond to induction frequencies to which silicon carbide responds. Appropriate materials for the block 31 include quartz or boron nitride, or other such materials. The chamber 30 may be formed of aluminum or other metals. Additionally, the block 31 has a cavity 32 therein in which a silicon carbide substrate 11 can be positioned.

The reaction chamber 30 contains means for suspending the substrate 11 substantially out of physical contact with any other object. For example, as shown in FIG. 2, these means may consist of an outlet 36 through which gases may flow in order to levitate the substrate 11 off of the block 31. In the embodiment shown in FIG. 2, both source gases and other gases may flow through outlet 36. Alternatively, only source gases may flow through outlet 36. In this case, the source gases both levitate the substrate 11 and form an epitaxial layer of silicon carbide upon the silicon carbide substrate 11. Outlet 36 may be shaped in a fashion similar to outlet 16 so as to direct the flow of gases within the chamber.

In this embodiment, the means for inductively heating the substrate is shown as a substantially planar or "pancake" electrode 38 formed within chamber 30. The electrode 38 may be positioned substantially parallel to the substrate placed or suspended in the cavity 32 for inductively heating the substrate 11 using a frequency to which silicon carbide is sufficiently responsive in order to inductively heat the silicon carbide substrate 11 to the temperature required for chemical vapor deposition of silicon carbide upon the suspended substrate 11. If a microwave frequency is used as the induction frequency, a microwave waveguide for receiving and directing microwave energy may also be employed.

While the disclosed embodiments are particularly suited for SiC growth, those skilled in the art will recognized that other epitaxial materials may also be used. Those skilled in the art will also recognize that other epitaxial layers may also be grown on substrate 11 as well as the first SiC epitaxial layer described herein.

In summary, a method and structure for substantially preventing undesired residual dopants or other impurities from becoming incorporated in growing epitaxial layers of silicon carbide during CVD is provided. The instant method and structure avoids the use of a susceptor for CVD epitaxial growth.

The structure of the levitated wafer CVD system of the present invention includes a reaction chamber, means within the reaction chamber for suspending the substrate out of physical contact with any other object, means for introducing source gases that will form an epitaxial layer into the chamber, and means for inductively heating the substrate suspended in the chamber at a frequency to which the substrate is sufficiently responsive to heat the substrate to the temperature required for CVD of the desired semiconductor material upon the suspended substrate.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of substantially preventing undesired residual dopants or other impurities from becoming incorporated in growing epitaxial layers of silicon carbide during chemical vapor deposition, the method comprising:

suspending a substrate, formed of a material upon which epitaxial layers of silicon carbide will form and having at least one surface suitable for epitaxial growth of silicon carbide thereon, substantially out of physical contact with any other solid object; while contacting the suitable surface of the substrate with gases that will form epitaxial layers of silicon carbide thereon; and while inductively heating the substrate using an induction frequency to which the substrate material is sufficiently responsive to heat the substrate to the temperatures required for chemical vapor deposition of silicon carbide.

2. A method according to claim 1 wherein the step of suspending the substrate comprises suspending the substrate in an upward flow of gas so that the suitable surface of the substrate is maintained in a substantially horizontal orientation during chemical vapor deposition of silicon carbide thereon.

3. A method according to claim 1 wherein the steps of suspending the substrate and contacting the at least one surface of the substrate with gases that will form epitaxial layers of silicon carbide comprise:

suspending the substrate in an upward flow of source gases so that the suitable surface of the substrate is maintained in a downwardly facing substantially horizontal orientation; and contacting the downwardly facing surface with the source gases during chemical vapor deposition of silicon carbide so that epitaxial growth on the downwardly facing surface takes place downwardly and substantially opposite the upward flow of source gases.

4. A method according to claim 3 wherein the step of suspending the substrate in an upward flow of source gases comprises suspending the substrate in the substantial absence of gases other than source gases.

5. A method according to claim 1 wherein the step of suspending the substrate comprises suspending a substrate wafer of silicon carbide having surface proportions that are substantially greater than its thickness.

6. The method of claim 1 further comprising the step of enclosing said substrate and said source gases in a housing.

7. A method according to claim 1 wherein the steps of suspending the substrate and contacting the at least one surface of the substrate with gases that will form epitaxial layers of silicon carbide comprise:

suspending the substrate in an upward flow of gas so that the suitable surface of the substrate is maintained in an upwardly facing substantially horizontal orientation; and contacting the upwardly facing surface with the source gases during chemical vapor deposition of silicon carbide so that epitaxial growth takes place upwardly on the suitable surface.

8. A method of substantially preventing undesired residual dopants or other impurities from becoming incorporated in growing epitaxial layers of silicon carbide during chemical vapor deposition, the method comprising:

suspending a silicon carbide substrate having at least one surface suitable for epitaxial growth of silicon carbide thereon in an upward flow of source gases that will form epitaxial layers of silicon carbide on the suitable surface and oriented so that the suitable surface of the silicon carbide substrate is maintained in a downwardly facing substantially horizontal orientation, and so that epitaxial growth on the downwardly facing surface takes place downwardly and substantially opposite the upward flow of the source gases; and inductively heating the silicon carbide substrate using an induction frequency to which silicon carbide is sufficiently responsive to heat the silicon carbide to the temperatures required for chemical vapor deposition of silicon carbide thereon.

9. A method according to claim 8 wherein the step of inductively heating the silicon carbide substrate comprises heating the substrate using electromagnetic energy in the radio frequency range.

10. A method according to claim 9 wherein the step of heating the substrate using electromagnetic energy in the radio frequency range comprises heating the substrate using a frequency of at least 500 kilohertz.

11. A method according to claim 9 wherein the step of heating the substrate using electromagnetic energy in the radio frequency range comprises heating the substrate using a frequency of about 13.56 megahertz.

12. A method according to claim 8 wherein the step of inductively heating the silicon carbide substrate comprises heating the substrate using electromagnetic energy in the microwave frequency range.

13. A method according to claim 12 wherein the step of heating the substrate using electromagnetic energy in the microwave frequency range comprises applying microwave energy to a waveguide that focuses the microwave energy upon the silicon carbide substrate.

* * * * *

UNITED STATES PATENT AND TRADEMARK OFFICE
CERTIFICATE OF CORRECTION

PATENT NO.   : 5,155,062
DATED        : October 13, 1992
INVENTOR(S)  : Thomas G. Coleman It is certified that error appears in the above-identified patent and that said Letters Patent is hereby corrected as shown below:

Column 1, line 39, "($cm^{-3}$" should be -- ($cm^{-3}$) --.

Column 2, line 52, should be a "." between "nitrogen" and "In".

Column 2, line 67, should be a "," after "heating".

Column 3, line 24, "system" should be -- System --.

Column 5, line 6, "3.56" should be -- 13.56 --.

Column 5, line 47, should be a "." between "13" and "The".

Column 6, line 65, "Well" should be -- well --.

Signed and Sealed this

Fifth Day of October, 1993

Attest:

BRUCE LEHMAN

Attesting Officer

Commissioner of Patents and Trademarks